US011056482B2

(12) United States Patent
Baek

(10) Patent No.: US 11,056,482 B2
(45) Date of Patent: Jul. 6, 2021

(54) SEMICONDUCTOR DEVICE WITH ELECTROSTATIC DISCHARGE PROTECTION

(71) Applicant: KEY FOUNDRY CO., LTD., Cheongju-si (KR)

(72) Inventor: Won Jong Baek, Cheongju-si (KR)

(73) Assignee: Key Foundry Co., Ltd, Cheongju-si (KR)

( * ) Notice: Subject to any disclaimer, the term of this patent is extended or adjusted under 35 U.S.C. 154(b) by 91 days.

(21) Appl. No.: 16/682,320

(22) Filed: Nov. 13, 2019

(65) Prior Publication Data
US 2020/0373293 A1 Nov. 26, 2020

(30) Foreign Application Priority Data
May 23, 2019 (KR) ........................ 10-2019-0060893

(51) Int. Cl.
*H01L 27/02* (2006.01)
*H01L 29/10* (2006.01)
*H01L 29/06* (2006.01)

(52) U.S. Cl.
CPC ...... *H01L 27/0274* (2013.01); *H01L 29/0623* (2013.01); *H01L 29/1083* (2013.01)

(58) Field of Classification Search
CPC ............. H01L 27/0274; H01L 29/0623; H01L 29/1083
See application file for complete search history.

(56) References Cited

U.S. PATENT DOCUMENTS

2018/0108799 A1* 4/2018 Stark .................. H01L 31/0352

FOREIGN PATENT DOCUMENTS

KR 10-2004-0082831 A 9/2004

\* cited by examiner

*Primary Examiner* — Thomas L Dickey
(74) *Attorney, Agent, or Firm* — NSIP Law

(57) ABSTRACT

A semiconductor device includes a P-type substrate, a P-type well region, an N-type well region, an N-type guard ring region, an insulating layer, a poly gate disposed, and a bulk region. The P-type well region is disposed on the P-type substrate and includes source regions and drain regions each spaced apart from the other. The N-type well region disposed and spaced apart from the P-type well region on the P-type substrate. The N-type guard ring region is disposed around perimeters of the P-type well region and the N-type well region. The insulating layer is disposed around the P-type well region and the N-type well region on the N-type guard ring region. The poly gate is disposed around the perimeter of the P-type well region and the N-type well region, respectively, on the insulating layer. The bulk region is disposed on the N-type guard ring region adjacent the poly gate.

22 Claims, 16 Drawing Sheets

SEMICONDUCTOR DEVICE WITH ELECTROSTATIC DISCHARGE PROTECTION

CROSS-REFERENCE TO RELATED APPLICATIONS

This application claims the benefit under 35 U.S.C. 119(a) of Korean Patent Application No. 10-2019-0060893 filed on May 23, 2019 in the Korean Intellectual Property Office, the entire disclosure of which is incorporated herein by reference for all purposes.

BACKGROUND

1. Field

The present description relates to a semiconductor device for electrostatic discharge protection, and more particularly, to a semiconductor device that minimizes a capacitor region required for gate coupling in a semiconductor device using a gate-coupled MOSFET.

2. Description of Related Art

Electrostatic discharge (hereinafter referred to as ESD) is a discharge phenomenon caused by static electricity. When high voltage static electricity is instantaneously generated at an external conductive line connected to an input or output circuit, the electrostatic discharge causes a transient current to flow through a part of the input or output circuit, causing destruction of a part of the input or output circuit. Therefore, most of the semiconductor chips have electrostatic discharge protection circuits at their input and output ends to protect an internal circuit against electrostatic damage. Generally, a semiconductor device includes an electrostatic discharge protection circuit between a pad and an internal circuit to protect an internal circuit. A device used for designing a protection circuit against electrostatic discharge stress is referred to as an electrostatic discharge protection device.

As semiconductor devices have become smaller in size and higher in integration density based on market demands, the susceptibility to static electricity continues to increase due to the thickness of the gate oxide film of a MOSFET (Metal-Oxide-Semiconductor Field Transistor) used in the semiconductor device becoming thinner and weaker. There is a need to effectively implement an electrostatic discharge protection device to protect the chip from static electricity.

There are various types of electrostatic discharge protection devices. For example, a Gate-Grounded NMOS performs an electrostatic discharge operation by turning on a parasitic bipolar junction transistor by a junction breakdown between a drain and a substrate. There is an effect of a gate bias on the performance of the electrostatic discharge protection operation of NMOS devices in GGNMOS. An NMOS may be triggered at a voltage lower than the threshold voltage causing avalanche breakdown by applying a bias of a predetermined magnitude, for example, 1V to 2V, to the gate of the NMOS.

In general, the following basic conditions are to be satisfied if a Gate Coupled NMOS (GCNMOS) device is to be effectively implemented.

First, an additional process to minimize the capacitor and resistor required for a gate coupling. Second, minimization of the consumption of the layout region, which is added to insert the capacitor and resistor into the protection circuit. Third, the capacity of the capacitor and the size of the resistor added are easy to adjust to a desired value. Fourth, when a capacitor and a resistor are added, excluding the possibility of occurrence of undesired malfunctions, such as latch-up.

However, typical techniques for adding a coupling capacitor and a coupling resistor to a GCNMOS device has so far has not sufficiently satisfied the above conditions.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a well region, a guard ring region, an insulating layer, and a poly gate. The well region includes a source region and a drain region, each spaced apart from the other. The guard ring region is disposed around a perimeter of the well region. The insulating layer is disposed, around the perimeter of the well region, on the guard ring region. The poly gate is disposed, around the perimeter of the well region, on the insulating layer.

The semiconductor device further includes a bulk region disposed on the guard ring region adjacent the poly gate.

A drain voltage is applied to the bulk region and the drain region.

A gate voltage is applied to the poly gate.

The well region further includes a well tap region.

A source voltage is applied to the well tap region and each of the source regions.

The semiconductor device further includes a buried impurity layer disposed spaced apart at a depth deeper than a depth of the well region; and a sink region formed under the guard ring region and disposed to be in contact with the buried impurity layer.

The semiconductor device is a gate-coupled first conductivity type semiconductor device or a gate-coupled second conductivity type semiconductor device.

In another general aspect, a semiconductor device includes a P-type substrate, a P-type well region, an N-type well region, an N-type guard ring region, an insulating layer, a poly gate disposed, and a bulk region. The P-type well region is disposed on the P-type substrate and includes source regions and drain regions each spaced apart from the other. The N-type well region disposed and spaced apart from the P-type well region on the P-type substrate. The N-type well region includes the source regions. The P-type well region includes the drain regions. The N-type guard ring region is disposed around perimeters of the P-type well region and the N-type well region. The insulating layer is disposed around the P-type well region and the N-type well region on the N-type guard ring region. The poly gate is disposed around the perimeter of the P-type well region and the N-type well region, respectively, on the insulating layer. The bulk region is disposed on the N-type guard ring region adjacent the poly gate.

The N-type guard ring region may include a first guard ring region forming a closed-loop around the perimeter of the P-type well region, and a second guard ring region, independent and separate from the first guard ring region, forming a closed-loop around the perimeter of the N-type well region.

The N-type guard ring region may include a first guard region disposed between the P-type well region and the N-type well region, a second guard region, connected to the first guard region in a closed loop, surrounding a portion of the perimeter of the P-type well region, and a third guard region, connected to the first guard region in a closed loop, surrounding a portion of the perimeter of the N-type well region.

The N-type guard ring region may be disposed in a closed loop surrounding both the P-type well region and the N-type well region.

A gate voltage may be applied to the poly gate.

A drain voltage may be applied to the bulk region and the drain regions.

The semiconductor device may further include a first buried layer disposed spaced apart at a depth deeper than a depth of the P-type well, and a first sink layer formed under the N-type guard ring and disposed to be in contact with the first buried layer.

The semiconductor device may further include a second buried layer disposed spaced apart at a depth deeper than a depth of the N-type well, and a second sink layer formed under the N-type guard ring and disposed to be in contact with the second buried layer.

In another general aspect, a semiconductor device with electrostatic discharge protection includes a deep well region, a well region, an insulating layer, a poly gate, and a bulk region. The well region, disposed in the deep well region, includes source regions and drain regions each spaced apart from the other, respectively. The insulating layer is disposed around a perimeter of the well region on the deep well region. The poly gate is disposed around the perimeter of the well region on the insulating layer. The bulk region is disposed on the deep well region adjacent the poly gate.

A gate voltage may be applied to the poly gate, and a drain voltage may be applied to the bulk region.

In another general aspect, a semiconductor device includes a P-type well region, a guard ring region, an insulating layer, and a poly gate. The P-type well region includes a well tap region, a source region, a gate electrode, and a drain region. The guard ring region is disposed around a perimeter of the P-type well region. The insulating layer is disposed, around the perimeter of the P-type well region, on the guard ring region. The poly gate is disposed, around the perimeter of the P-type well region, on the insulating layer.

An epitaxial layer may be disposed around the P-type well region.

An isolation region may be disposed between the guard ring region and the P-type well region.

In another general aspect, a semiconductor device includes a P-type well region, an N-type deep well region, an insulating layer, and a poly gate. The P-type well region includes a well tap region, a source region, a gate electrode, and a drain region. The N-type deep well region is disposed around the P-type well region. The insulating layer is disposed, around the perimeter of the P-type well region, on the N-type deep well region. The poly gate is disposed, around the perimeter of the P-type well region, on the insulating layer.

An isolation region may be disposed between the guard ring region and the poly gate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
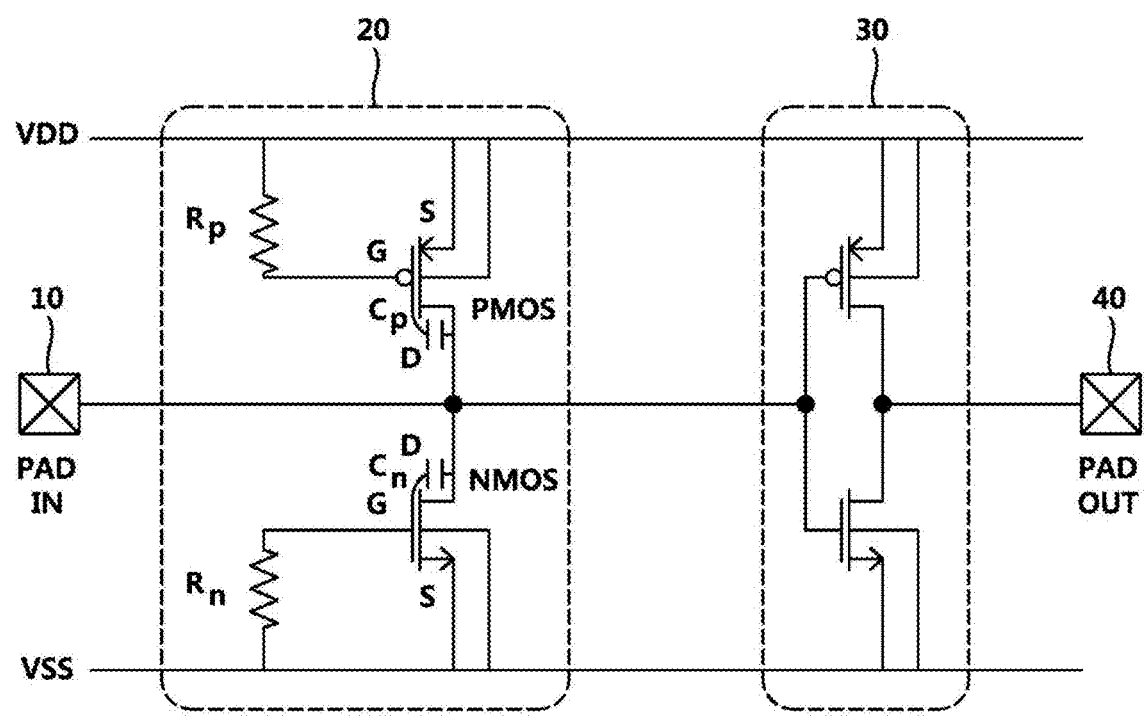
FIG. 1 is a circuit diagram illustrating an example of a semiconductor device of the present description.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The present description provides a semiconductor device for electrostatic discharge protection which may reduce the area of a device without additional process. In order to apply a bias of a predetermined magnitude to the gate, a Gate-Coupled NMOS (hereinafter referred to as GCNMOS) device having a capacitor disposed between a gate and an input pad is provided.

In the following description, the well region may be N-type when the substrate of the semiconductor device is P-type, according to an example, or the well region may be P-type when the substrate is N-type, according to another example.

Figure 2:
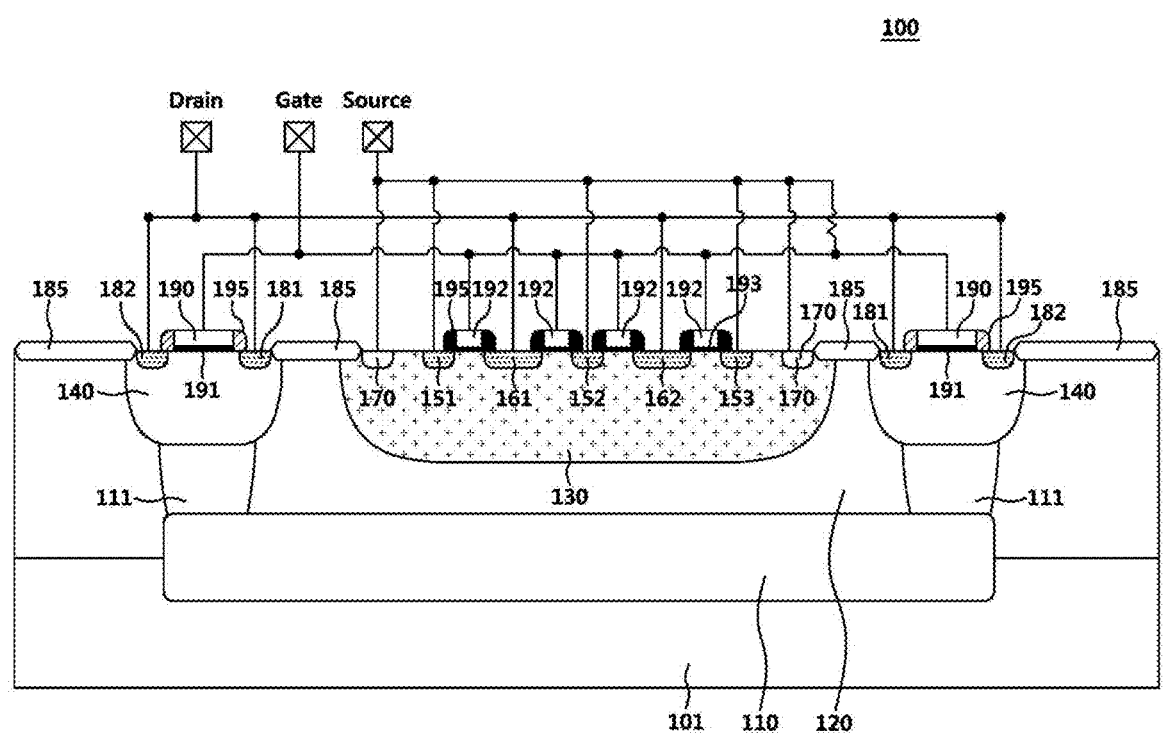
FIG. 2 is a cross-sectional view illustrating a Gate-Coupled NMOS (GCNMOS) device according to an example.

FIG. 1 is a circuit diagram illustrating a semiconductor device of the present description, and FIG. 2 is a cross-sectional view illustrating a Gate-Coupled NMOS (GCN-MOS) device according to an example.

Referring to FIG. 1, the semiconductor device includes a semiconductor device for electrostatic discharge protection 20 and an input buffer 30 at an input pad 10. The data inputted through the input pad 10 is inputted to the internal circuit 40 of the semiconductor device through the semiconductor device for electrostatic discharge protection 20 and the input buffer 30.

The semiconductor device for electrostatic discharge protection 20 includes a PMOSFET and an NMOSFET. In the PMOSFET, a drain terminal is connected to the input pad 10, which is connected to the input buffer 30, and the source S is connected to a power supply terminal VDD. In the NMOSFET, the gate G and the source S are connected to the ground terminal VSS and the drain D is connected to the input pad 10.

A first coupling capacitor Cp is disposed between the gate G and the drain D of the PMOSFET for gate coupling, and a first coupling resistor Rp is disposed between the gate G and the source S. A second coupling capacitor Cn is disposed between the gate G and the drain D of the NMOSFET, and a second coupling resistor Rn is disposed between the gate G and the source S.

The semiconductor device for ESD protection 20 transmits data inputted to the input pad 10 to the internal circuit 40 through the input buffer 30 during normal operation. However, when an electrostatic discharge ESD occurs, an electrical bias is applied to the drain D of the NMOSFET and the PMOSFET causing an electrical bias to be also applied to the gate G through the coupling capacitor, so that the NMOSFET and the PMOSFET operate at a low voltage. That is, when an electric potential is applied to the gate G, the semiconductor device for ESD protection operates faster than the device of the internal circuit 40.

The capacities of the first and second coupling capacitors Cp and Cn determine the magnitude of the electrical bias applied to the gate. The first and second coupling resistances Rp and Rn, which are connected between the gate and the power terminal or between the gate and the ground terminal, determine the time at which the electrical bias applied to the gate disappears. In order to effectively protect the thin gate oxide film of the input buffer 30, it is desirable to optimize factor values of the capacities of the coupling capacitor and the size of the coupling resistors.

Referring to FIG. 2, a gate-coupled NMOS (hereinafter referred to as GCNMOS) is disclosed in the semiconductor device for ESD protection 20 of FIG. 1.

In the GCNMOS 100, an epitaxial layer 120 is formed on a substrate 101. In one example, the substrate 101 and the epitaxial layer 120 may have P-type conductivity.

Referring to FIG. 2, a P-type well region 130 is formed on the epitaxial layer 120. An N-type well region 140 is also formed on the epitaxial layer 120. The N-type well region 140 is formed to surround the perimeter of the P-type well region 130 spaced apart at a predetermined distance from the P-type well region 130. N-type well region 140 is a guard ring region for isolating adjacent semiconductor device.

The P-type well region 130 and N-type well region 140 may be referred to as an active region. An isolation region 185 is disposed on the remaining region, excluding the active region and the guard ring region, to be isolated from other semiconductor devices disposed nearby.

Referring to FIG. 2, the isolation region 185 may be formed as a trench structure or LOCOS, according to various examples. In order to prevent interference between devices and to physically isolate devices, the isolation region 185 may be formed of an insulating material and formed thicker than the gate insulating layer.

A guard ring gate insulating layer 191 is formed to be disposed to surround the perimeter of the P-type well region 130 on the N-type well region 140. A guard ring poly gate electrode 190 is formed on the guard ring gate insulating layer 191. The poly gate electrode 190 is connected to the gate terminal (Gate).

Referring to FIG. 2, a plurality of gate insulating layer 193 is formed at a predetermined distance with each other on the P-type well region 130, and a plurality of gate electrode 192 is formed on the gate insulating layer 193. The gate electrode 192 is connected to the gate terminal (Gate). The plurality of gate electrode 192 is doped with N-type impurities. So N-type gate electrodes are formed on the P-type first well region 130.

The guard ring gate insulating layer 191 and the guard ring poly gate electrode 190, which are formed on the N-type well region, are formed in the same process as the gate insulating layer 193 and the gate electrode 192, which are formed on the P-type well region, but are given different names in order to distinguish from each other. That is, the guard ring gate insulating layer 191 and the guard ring poly gate electrode 190 may not require a separate additional process and are formed at the same time as the gate insulating layer 193 and the gate electrode 192 of the GCNMOS are formed. Further, spacers 195 are included on both sides of the guard ring poly gate electrode 190 on the N-type well region 140. Both sides of the gate electrode 192 formed on the P-type well region has the same structure.

Referring to FIG. 2, impurities are implanted into both sides of the gate electrode 192 on the P-type well region 130 to form at least one source region 151, 152, 153, and drain region 161, 162, respectively. The source regions 151, 152 and 153 are connected to a source terminal (Source), and the drain regions 161 and 162 are connected to a drain terminal (Drain), respectively.

Referring to FIG. 2, the GCNMOS 100 may include at least one well tap region 170. The well tap region 170 is a region that is independently disposed on the P-type well region 130 on which the source regions 151, 152, and 153 and the drain regions 161 and 162 are not disposed, and is formed by implanting P-type impurities. The well tap region 170 is electrically connected to a source terminal (Source) to hold the electric potential of the P-type well region 130 in accordance with a bias applied to the source terminal.

Referring to FIG. 2, the GCNMOS 100 may further include an N-type buried impurity layer 110, according to an example. The N-type buried impurity layer 110 is formed between the boundary of the substrate 101 and the epitaxial layer 120 spaced apart at a predetermined depth under the P-type well region 130. The N-type buried impurity layer 110 is formed under the P-type well region 130 and the N-type well region 140. The GCNMOS 100 further includes an N-type sink region 111, which is formed between the N-type well region 140, and the N-type buried impurity layer 110. So the N-type well region 140, the N-type sink region 111 and the N-type buried impurity layer 110 are connected with each other.

The GCNMOS 100 includes highly doped N-type bulk regions 181 and 182. The N-type bulk regions 181 and 182 are formed in the N-type well region 140 exposed on both sides of the guard ring poly gate 190. The N-type bulk regions 181 and 182 are connected to the drain terminal (Drain) so as to hold the electric potential of the N-type buried impurity layer 110, which is connected through the N-type well region 140 and the N-type sink region 111 according to the bias applied to the drain terminal.

The N-type sink region 111 and the buried impurity layer 110 isolate the GCNMOS 100 from the external region. As illustrated in FIG. 2, different electric potentials may be applied to the respective regions by isolating an internal P-type region in which the GCNMOS device 100 exists and an external P-type region in which the GCNMOS device 100 does not exist.

In the GCNMOS 100, the ground terminal VSS is connected to the gate terminal (Gate), and the bias of the ground terminal is applied to the gate electrode 192 and the guard ring poly gate 190. A source terminal (Source) is also connected to the ground terminal VSS, and a bias of the ground terminal is applied to the source regions 151, 152, 153, and the well tap region 170. The drain terminal (Drain) is connected to the input terminal 10, and a bias is applied to the drain regions 161 and 162 and the bulk regions 181 and 182 according to inputted data.

As a result, a parasitic capacitance is formed between the guard ring poly gate 190 and the N-type well region 140. Even when ESD is inputted to the input terminal 10, an electrical bias is applied to the gate by the parasitic capacitance; thereby the GCNMOS 100 operates rapidly at a low voltage that the inputted ESD flows to the ground terminal.

Although the GCNMOS 100 is illustrated in FIG. 2 for the convenience of description, the structure of the gate-coupled PMOS is similar to that of the GCNMOS 100. In the case of GCPMOS, an N-type well region is formed in a substrate. An N-type guard ring region disposed to surround the perimeter of the N-type well region, an insulating layer disposed to surround the perimeter of the N-type well region on the N-type guard ring region, and a poly gate which is disposed to surround the perimeter of the N-type well region on the insulating layer are included.

The GCPMOS includes a guard region, which surrounds the P-type well region of the GCNMOS and the N-type well region of the GCPMOS together. Specifically, the guard region includes a first guard region between the P-type well region and the N-type well region, a second guard region, which surrounds the remaining perimeter of the P-type well region excluding the first guard region while connected to the first guard region in a closed-loop, and a third guard region, which surrounds the remaining perimeter of the N-type well region excluding the first guard region while connected to the first guard region in a closed loop.

Since the bulk region, the buried layer, the sink layer, and the voltage application of the GCPMOS are the same as that of the GCNMOS, the elements will be described with reference to FIG. 4.

Figure 3:
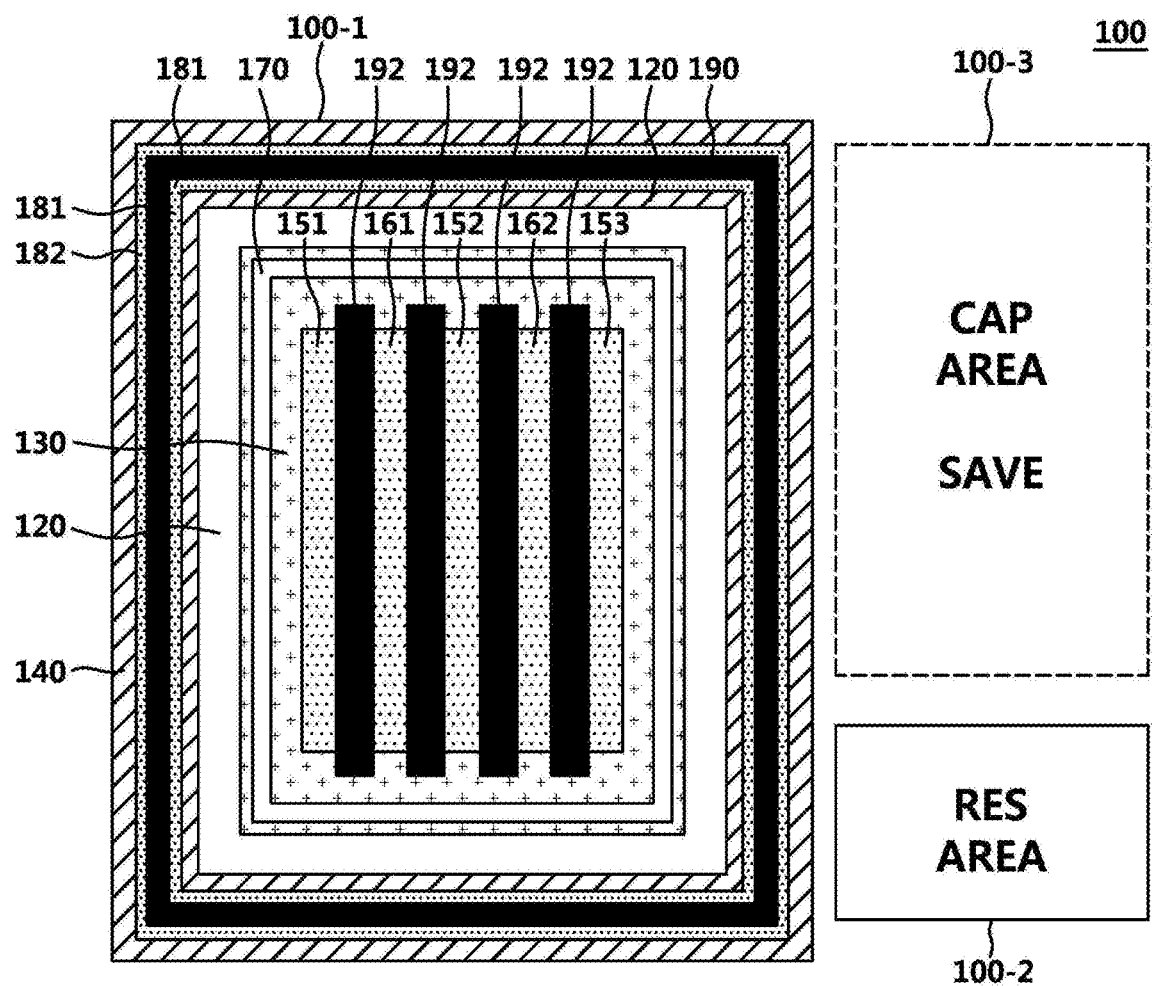
FIG. 3 is a top view of FIG. 2.

FIG. 3 is a top view of FIG. 2.

As shown in FIG. 3, the semiconductor device of the present description includes a GCNMOS device region 100-1 and a coupling resistor region 100-2. However, an additional area for the coupling capacitor region 100-3 is not required, because the coupling capacitor region 100-3 is moved to GCNMOS device region 100-1. That is, the coupling capacitor region 100-3 is implemented by implementing a coupling capacitor as the guard ring poly gate 190 in the first guard ring region 140 existing in the GCNMOS device region 100-1. So the total chip size of the semiconductor device may be reduced.

In FIG. 3, the GCNMOS device region is surrounded by an N-type well region, the first guard ring region 140, for isolating from an adjacent semiconductor device. The guard ring poly gate 190 is disposed on the first guard ring region 140. Bulk regions 181 and 182 are disposed in the first guard ring region 140 on both sides of the guard ring poly gate 190.

In FIG. 3, the P-type well region 130 is disposed inside the first guard ring region 140. The well tap region 170 may be disposed in the form of a ring in the horizontal direction of the upper surface of the P-type well region 130 in the P-type well region 130.

In FIG. 3, a plurality of gate electrode 192 is disposed to be spaced apart at a predetermined distance with each other on the inside of the well tap region 170 and on the P-type well region 130. The gate electrodes 192 are repeated as a stripe type. The source regions 151, 152 and 153 and the drain regions 161 and 162 are disposed alternately on both sides of the gate electrodes 192.

Thus, in the first guard ring region 140, the bulk regions 181 and 182 are disposed on the single guard ring poly gate 190 and both sides of the guard ring poly gate 190. The gate and drain terminals are connected to each of the guard ring poly gate 190 and the bulk regions 181 and 182, respectively. That is, it may serve as a coupling capacitor between the gate and the drain of the GCNMOS, and serve as a capacitor having a capacitance larger than the existing parasitic capacitor. Therefore, when an ESD enters the input pad, that is, the drain terminal, the operating voltage of the GCNMOS becomes small due to the large coupling capacitor, thereby resulting in fast turn-on effect. Prior to affecting the input buffer and internal circuit due to ESD, the fast turn-on of the GCNMOS allows the ESD to flow to the ground through the NMOS.

Figure 4:
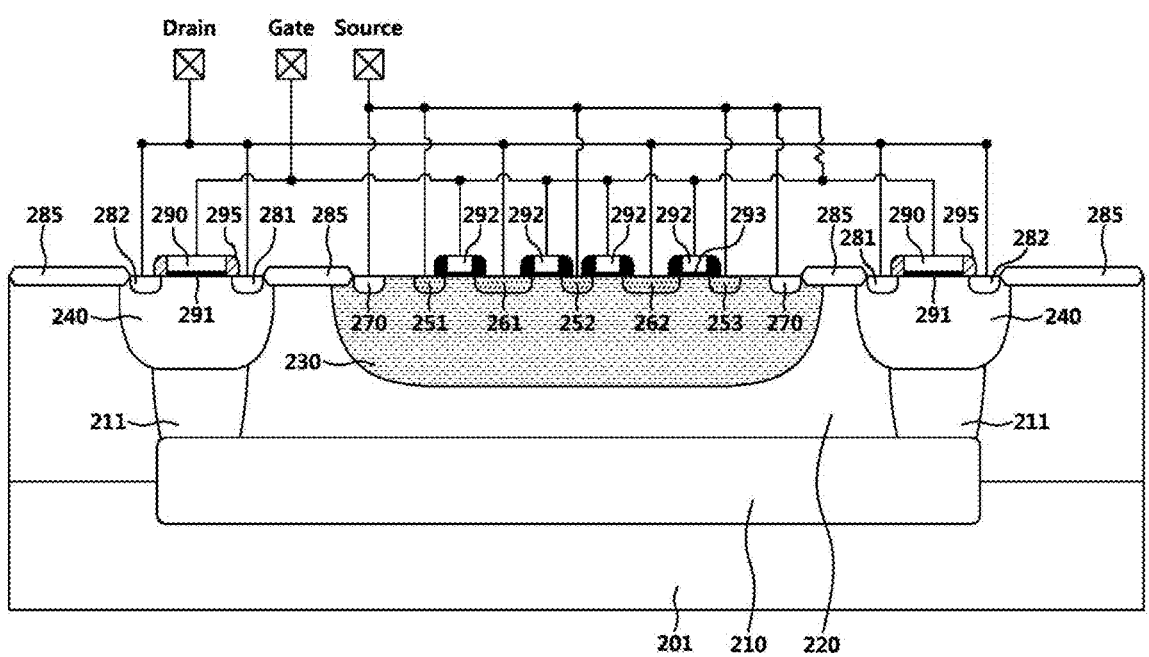
FIG. 4 is a cross-sectional view illustrating a Gate-Coupled PMOS (GCPMOS) device according to an example.
Figure 5:
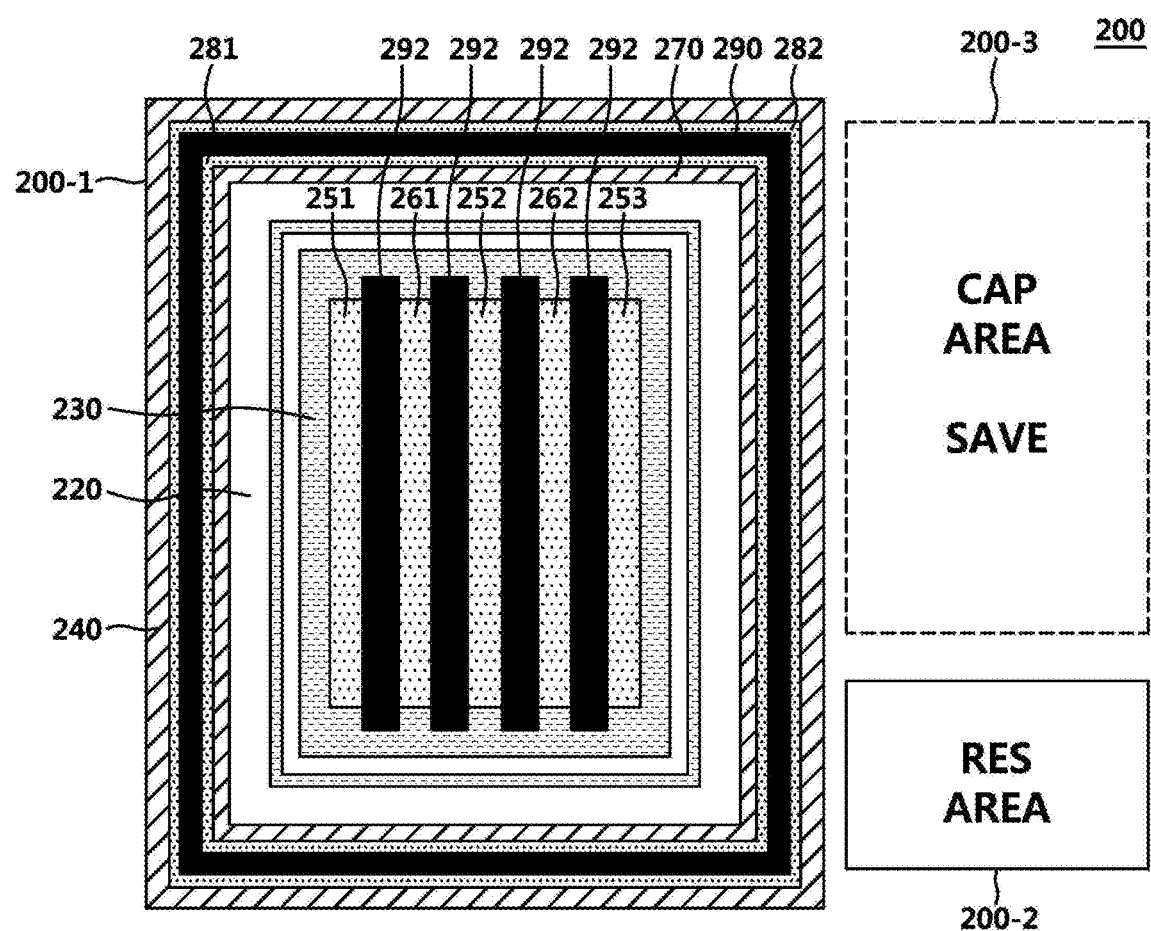
FIG. 5 is a top view of FIG. 4.

FIG. 4 is a cross-sectional view illustrating a GCPMOS device according to an example of the present description, and FIG. 5 is a top view of FIG. 4. The GCPMOS device represents the PMOS device of FIG. 1.

Referring to FIG. 4, the GCPMOS 200 has an epitaxial layer 220 formed on a substrate 201. In one example, the substrate 201 and the epitaxial layer 220 may have a P-type conductivity type.

Referring to FIG. 4, an N-type first well region 230 is formed in the epitaxial layer 220 of the GCPMOS 200. An N-type second well region 240 is also formed in the epitaxial layer 220. The N-type second well region 240 is formed to surround the perimeter of the N-type first well region 230 spaced apart at a predetermined distance from the N-type first well region 230. The N-type second well region 240 is a guard ring region for isolating from an adjacent semiconductor device.

The N-type first well region 230 and the guard ring region may also be referred to as an active region. An isolation region 285 is disposed on the remaining region excluding the active region and the guard ring region, so that the isolation region 285 may be isolated from other semiconductor devices disposed nearby. For preventing interference and physical isolation between devices, the isolation 285 is formed of an insulating material and to be formed thicker than the gate insulating layer.

Referring to FIG. 4, a guard ring poly gate electrode 290 is formed on the N-type second well region 240. The guard ring poly gate electrode 290 is connected to the gate terminal (Gate). Highly doped bulk regions 281 and 282 are formed in the N-type second well region 240 on both sides of the guard ring poly gate electrode 290.

Referring to FIG. 4, a plurality of gate electrode 292 is formed on the N-type first well region 230 at a predetermined distance with each other. The plurality of gate electrode 292 is connected to the gate terminal (Gate). The plurality of gate electrode 292 is doped with P-type impurities. So P-type gate electrodes are formed on the N-type first well region 230.

Referring to FIG. 4, P-type impurities are implanted between the gate electrodes 292 to the N-type first well region 230 to form source regions 251, 252, and 253 and drain regions 261 and 262, respectively. The source regions 251, 252 and 253 are respectively connected to the source terminal (Source), and the drain regions 261 and 262 are connected to the drain terminal (Drain).

Referring to FIG. 4, the GCPMOS 200 may include at least one well tap region 270. The highly doped N-type well tap region 270 is disposed on the N-type first well region 230 spaced apart from the source regions 251, 252, and 253 and the drain regions 261 and 262. The highly doped N-type well tap region 270 is electrically connected to a source terminal (Source) to hold the electric potential of the N-type first well region 230 according to a bias applied to the source terminal.

Referring to FIG. 4, the GCPMOS 200 may further include an N-type buried impurity layer 210, according to an example. The N-type buried impurity layer 210 is formed between the substrate 201 and the epitaxial layer 220 spaced apart at a predetermined depth under the N-type first well region 230. The buried impurity layer 230 is doped with an N-type impurity and is formed under the N-type second well region 240 and the N-type first well region 230. The GCPMOS 200 further includes an N-type sink region 211. The N-type sink region 211 is formed between the N-type second well region 240 and the N-type buried impurity layer 210. So the N-type second well region 240, the N-type sink region 211, and the N-type buried impurity layer 210 are connected with each other.

Referring to FIG. 4, the GCPMOS 200 includes highly doped N-type bulk regions 281 and 282. The bulk regions 281 and 282 are formed on both sides of the guard ring poly gate 290 in the N-type second well region 240. The highly doped N-type bulk regions 281 and 282 are connected to drain terminal (Drain), and hold the electric potential of the N-type buried impurity layer 210 which is connected via the N-type second well region 240 and the N-type sink region 211 in accordance with a bias applied to the drain terminal.

The N-type sink region 211 and the N-type buried impurity layer 210 divide the GCPMOS 200 into an inner region and an outer region. As shown in FIG. 4, different electric potentials may be applied to each region by dividing the internal P-type region and the external P-type region.

In the GCPMOS 200, the power supply terminal VDD is connected to the gate terminal (Gate), and the bias of the power supply terminal is applied to the gate electrode 292 and the guard ring poly gate 290. A source terminal (Source) is also connected to the power terminal, and a bias of the power terminal is applied to the source regions 251, 252, and 253, and the contact region 270. The drain terminal (Drain) is connected to the input terminal 10, and bias is applied via the input pad to the drain regions 261 and 262 and the bulk regions 281 and 282.

As a result, a parasitic capacitance of a large capacitor capacitance is formed between the guard ring poly gate 290 and the N-type second well region 240, and even if ESD is inputted to the input terminal 10, the parasitic capacitance of a large capacitor capacitance enables the GCPMOS 100 to operate at a low voltage. That is, when ESD is inputted, a GCNMOS and a GCPMOS may be turned on quickly before the ESD enters the input buffer and internal circuit, thereby allowing ESD to escape through a PMOS.

As illustrated in FIG. 5, the semiconductor device of the present description includes the GCPMOS device region 200-1 and the coupling resistor region 200-2. The additional coupling capacitor region 200-3 is not necessary, because the coupling capacitor region 200-3 is moved to the GCPMOS device region 200-1. The coupling capacitor region 200-3 implements the coupling capacitor as a poly gate in the guard ring region 240 existing in the GCPMOS device region 200-1, thereby the chip size of the semiconductor device may be reduced.

In FIG. 5, the GCPMOS device region is surrounded by an N-type second well region, that is, a guard ring region 240, for isolating from adjacent semiconductor devices. A guard ring poly gate 290 is disposed on the guard ring region 240, and bulk regions 281 and 282 are disposed in the guard ring region 240 on both sides of the guard ring poly gate 290.

The N-type first well region 230 is disposed inside the guard ring region 240. The well tap region 270 may be disposed in a ring shape in the horizontal direction of the upper surface of the N-type first well region 230 in the N-type first well region 230.

A plurality of gate electrode 292 is disposed within the closed area of the well tap region 270 and spaced apart at a predetermined distance. The source regions 251, 252, and 253 and the drain regions 261 and 262 are alternately disposed on both sides of the plurality of gate electrode 292.

Figure 6:
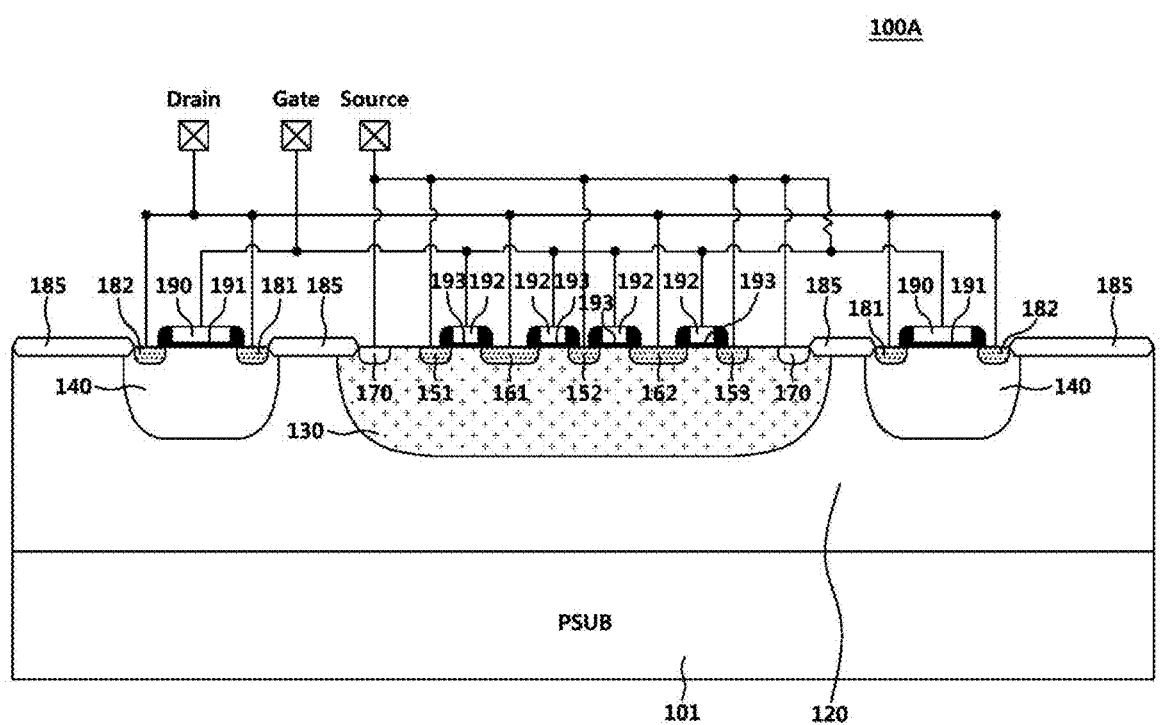
FIG. 6 is a cross-sectional view illustrating a GCNMOS device according to another example.

FIG. 6 is a cross-sectional view illustrating a GCNMOS device according to another example. For the convenience of description, the difference from the GCNMOS device shown in FIG. 2 will be mainly described.

Referring to FIG. 6, the GCNMOS 100A may be implemented without a buried impurity layer. The GCNMOS 100A forms a P-type well region 130 on the P-type epitaxial layer 120. Neither buried impurity layer nor a sink region is formed between the epitaxial layer 130 and the substrate 101.

Figure 7:
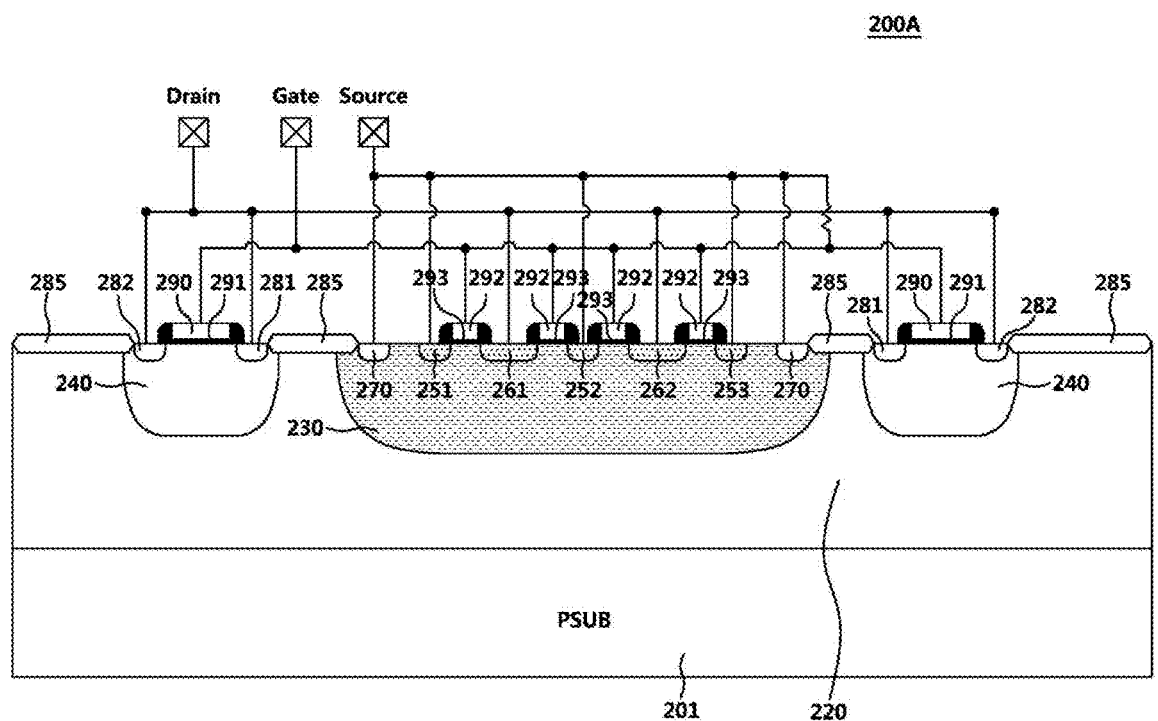
FIG. 7 is a cross-sectional view illustrating a GCPMOS device according to another example.

FIG. 7 is a cross-sectional view illustrating a GCPMOS device according to another example. For the convenience of description, differences from the GCPMOS device shown in FIG. 4 will be mainly described.

Referring to FIG. 7, the GCPMOS 200A may be implemented without a buried impurity layer. The GCPMOS 200 forms an N-type well region 230 on the P-type epitaxial layer 220. Neither a buried impurity layer nor a sink region is formed between the epitaxial layer 230 and the substrate 201.

The semiconductor device shown in FIG. 6 and FIG. 7 will be referred to as a structure that is divided into inner/outer parts as a buried impurity layer and a sink region, and a separate bias is not applied.

Figure 8:
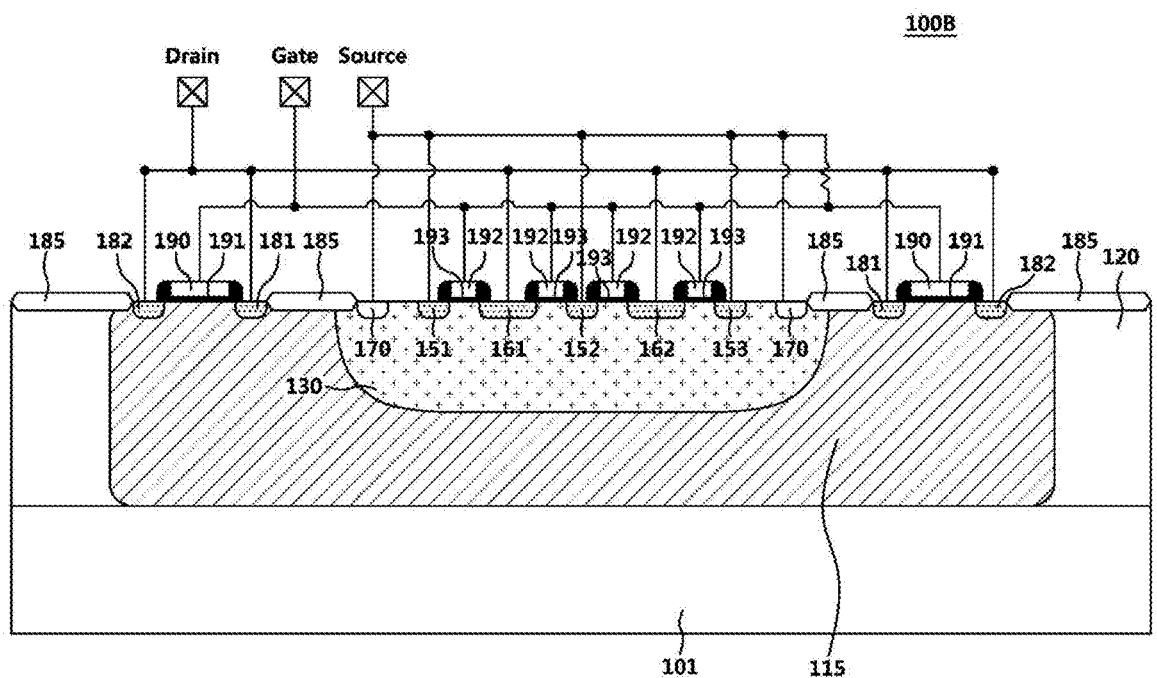
FIG. 8 is a cross-sectional view illustrating a GCNMOS device according to another example.
Figure 9:
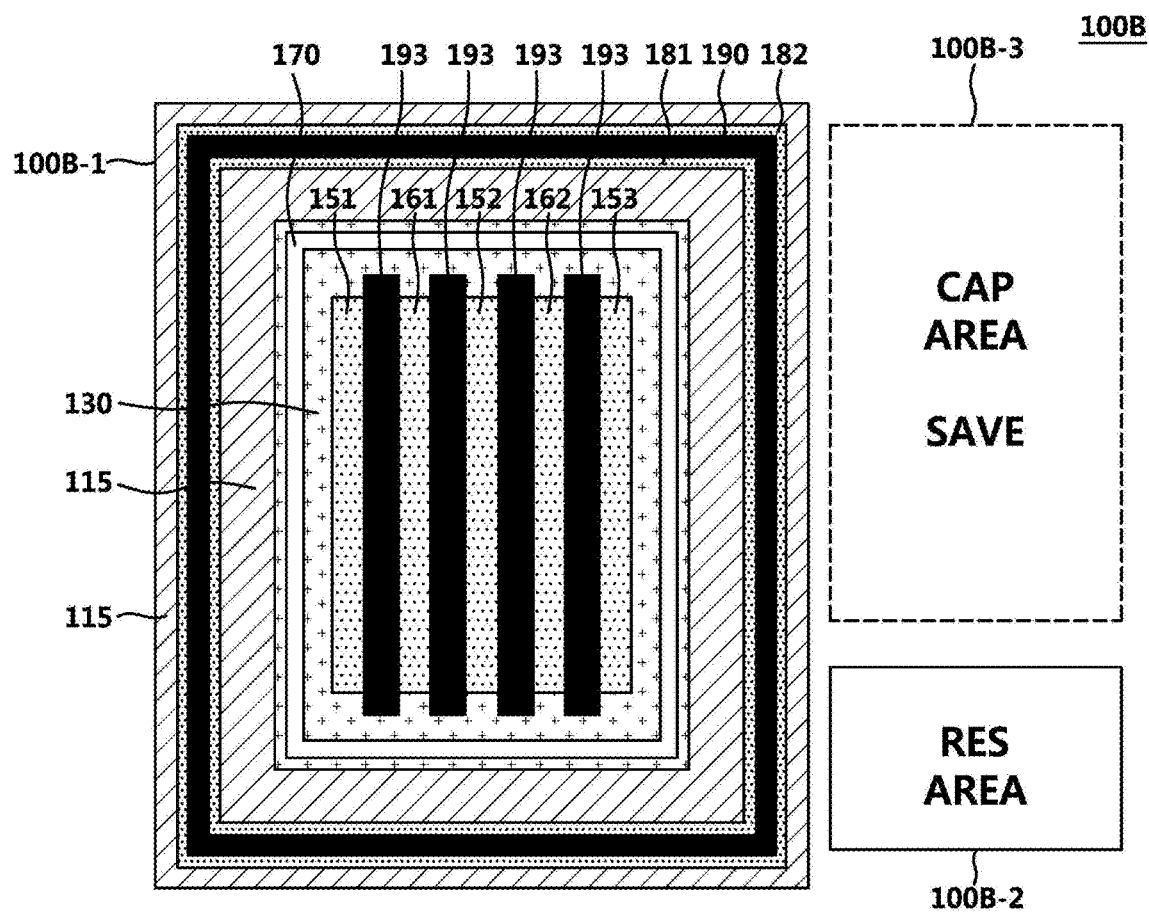
FIG. 9 is a top view of FIG. 8.

FIG. 8 is a cross-sectional view of a GCNMOS device according to another example of the present description, and FIG. 9 is a top view of FIG. 8. For the convenience of description, the difference from the GCNMOS device shown in FIG. 2 will be mainly described.

Referring to FIG. 8, the GCNMOS 100B includes a P-type epitaxial layer 120 formed on a P-type substrate 101, and an N-type deep well region 115 is formed on the epitaxial layer 120. In the N-type deep well region 115, a P-type well region 130 is formed. The X-Y axis length on the plane of the upper surface of the N-type deep well region 115 is longer than that of the P-type well region 130. That is, the P-type well region 130 is disposed so as to be included in the center of the N-type deep well region 115, as shown in FIG. 9.

Referring to FIG. 8, a guard ring poly gate insulating layer 191 is formed to be disposed to surround the perimeter of the P-type well region 130 on the N-type deep well region 115. A guard ring poly gate electrode 190 is formed on the guard ring gate insulating layer 191. A guard ring poly gate electrode 190 is also disposed along the guard ring poly gate insulating layer 191 to surround the P-type well region 130. However, the guard ring poly gate insulating layer 191 and the guard ring poly gate electrode 190 are disposed spaced apart at a predetermined distance from the boundary of the P-type well region 130, respectively. The guard ring poly gate electrode 190 is connected to the gate terminal (Gate).

That is, unlike the example of FIG. 2, the GCNMOS 100B shown in FIGS. 8 and 9 does not include the N-type well region 140, the sink region, and the buried impurity layer of FIG. 2. The N-type deep well region 115 is formed isolated from the adjacent devices and is electrically isolated from the adjacent devices since a separate bias is applied through the bulk regions 181 and 182.

In FIG. 9, the NMOS device region is formed in the N-type deep well region 115 for isolating an adjacent semiconductor device. A guard ring poly gate 190 is disposed on the N-type deep well region 115 along the perimeter of the N-type deep well region 115, and bulk regions 181 and 182 are disposed in the N-type deep well region 115 on both sides of the guard ring poly gate 190.

A P-type well region 130 is disposed inside the guard ring poly gate 190. The well tap region 170 may be disposed in the P-type well region 130 in the form of a P-type ring in the horizontal direction of the upper surface of the P-type well region 130.

In FIG. 9, a plurality of gate electrode 192 is disposed spaced apart at a predetermined distance inside the P-type well region 130. The source regions 151, 152 and 153 and the drain regions 161 and 162 are alternately disposed on both sides of the plurality of gate electrode 192.

Figure 10:
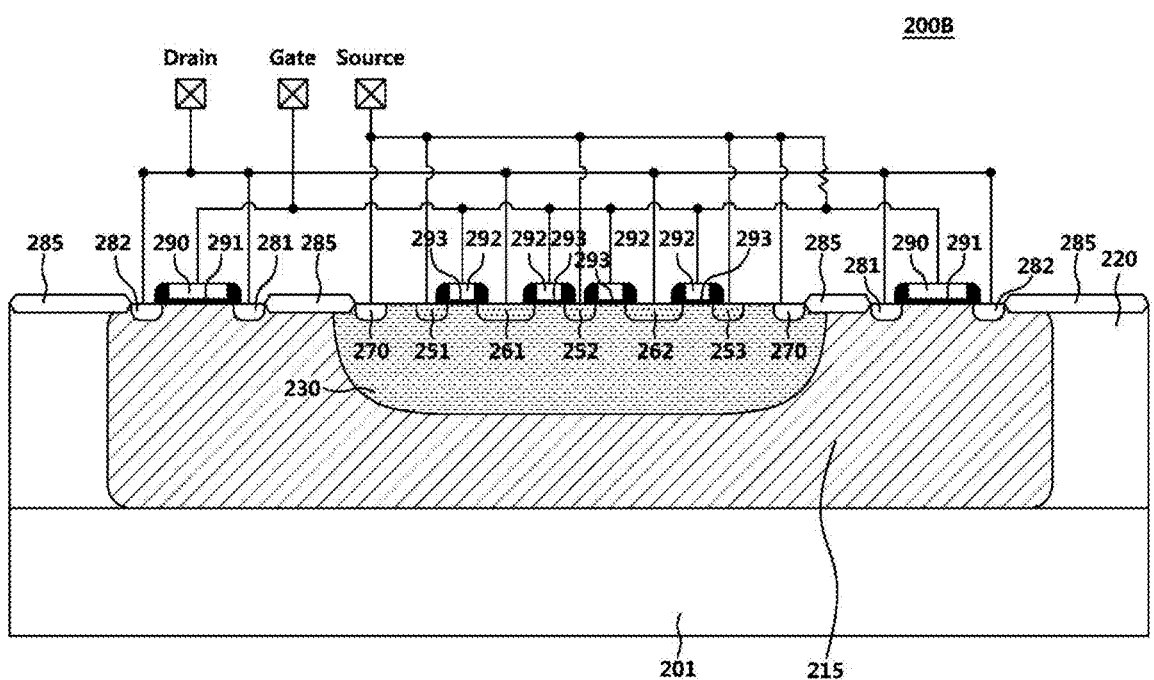
FIG. 10 is a cross-sectional view of a GCPMOS device according to another example.
Figure 11:
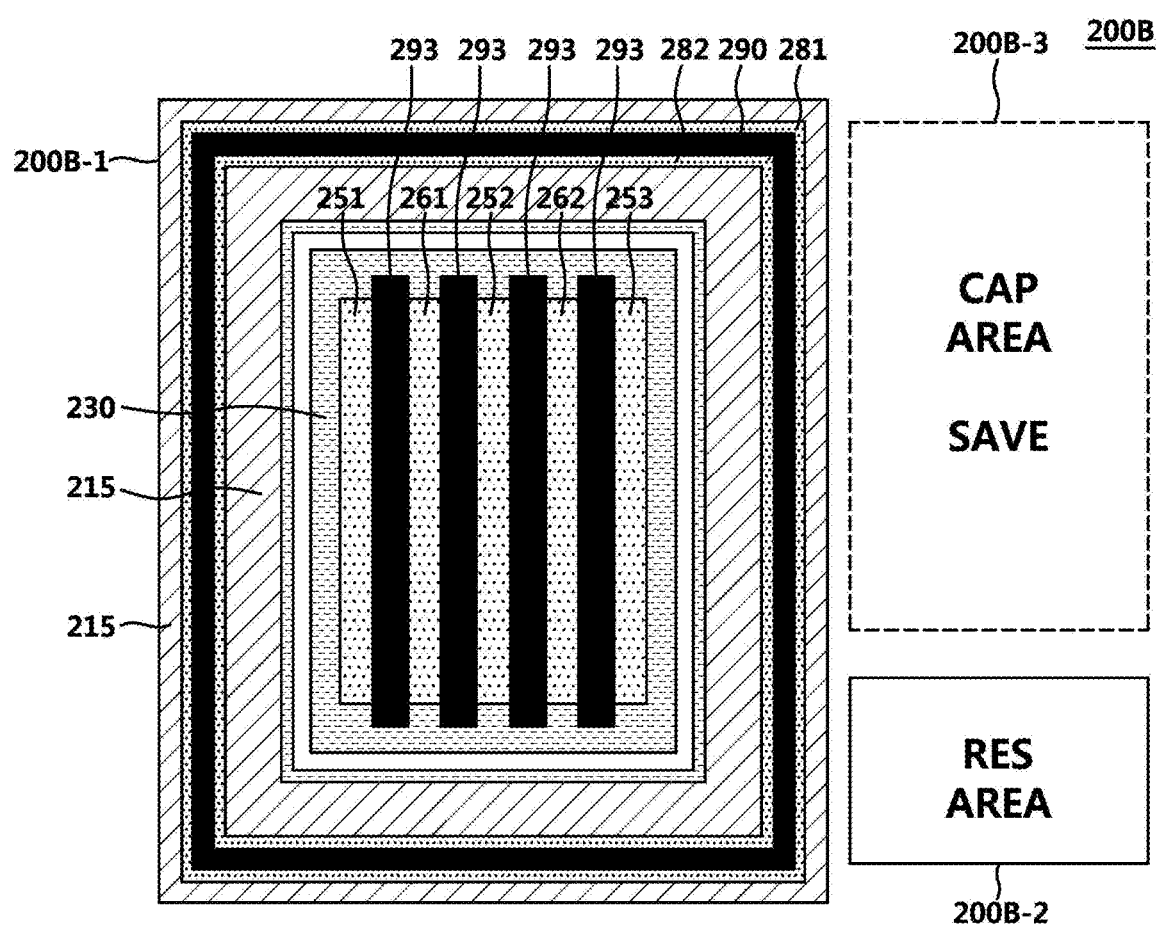
FIG. 11 is a top view of FIG. 10.

FIG. 10 is a cross-sectional view of a GCPMOS device according to another example of the present description, and FIG. 11 is a top view of FIG. 10. For convenience of description, differences from the GCPMOS device shown in FIG. 4 will be mainly described.

Referring to FIG. 10, the GCPMOS 200B may form a P-type epitaxial layer 220 on the P-type substrate 201 and an N-type deep well region 215 on the epitaxial layer 220. In the N-type deep well region 215, an N-type well region 230 is formed. The X-Y axis length on the plane on the N-type deep well region 215 is longer than the N-type well region 230. That is, the N-type well region 230 is disposed so as to be included in the center of the N-type deep well region 215, as shown in FIG. 10.

Referring to FIG. 10, a guard ring poly gate insulating layer 291 is formed to be disposed to surround the perimeter of the N-type well region 230 on the N-type deep well region 215. A guard ring poly gate electrode 290 is formed on the guard ring gate insulating layer 291. A guard ring poly gate electrode 290 is also disposed surrounding the perimeter the N-type well region 230 along the guard ring poly gate insulating layer 291. However, the guard ring poly gate insulating layer 291 and the guard ring poly gate electrode 290 are spaced apart at a predetermined distance from the boundary of the N-type well region 230, respectively. The guard ring poly gate electrode 290 is connected to the gate terminal (Gate).

Unlike the example of FIG. 4, the GCPMOS 200B shown in FIGS. 10 and 11 does not include the N-type second well region 240, the sink region, and the buried impurity layer of FIG. 4. The N-type deep well region 215 is formed isolated from the adjacent devices and is electrically isolated from the adjacent devices because a separate bias is applied through the bulk regions 281 and 282.

In FIG. 10, the GCPMOS device region is formed in the N-type deep well region 215 for isolating an adjacent semiconductor device. A guard ring poly gate 290 is disposed on the N-type deep well region 215 along the perimeter of the N-type deep well region 215 and bulk regions 281 and 282 are disposed in the N-type deep well region 215 on both sides of the guard ring poly gate 290.

In FIG. 10, the N-type well region 230 is disposed inside the N-type deep well region 215. The well tap region 270 may be disposed in a ring shape in the horizontal direction of the upper surface of the N-type well region 230 in the N-type well region 230.

In FIGS. 10 and 11, a plurality of gate electrode 292 is disposed spaced apart at a predetermined distance inside the N-type well region 230. The source regions 251, 252, and 253 and the drain regions 261 and 262 are alternately disposed on both sides of the plurality of gate electrode 292.

The electrostatic discharge protection device 20 of FIG. 1 may be implemented as the semiconductor device shown in FIGS. 12 to 17. Hereinafter, each example will be described in detail, but the description of each structure of the GCNMOS (A) and the GCPMOS (B) will be omitted as those are according to the example described in FIG. 2 to FIG. 11.

Figure 12:
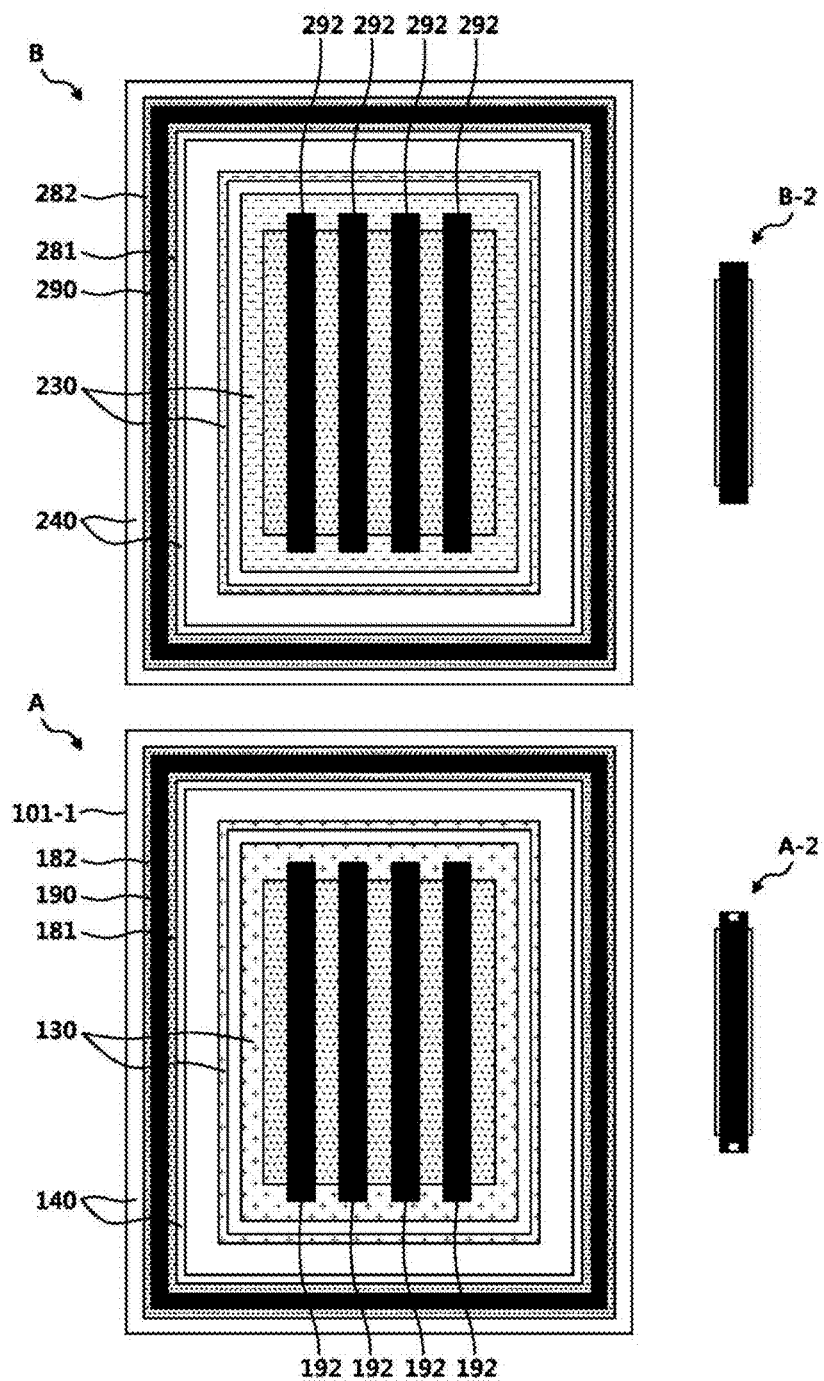
FIG. 12 is a top view of a semiconductor device in which a GCPMOS and a GCNMOS are combined according to an example.
Figure 13:
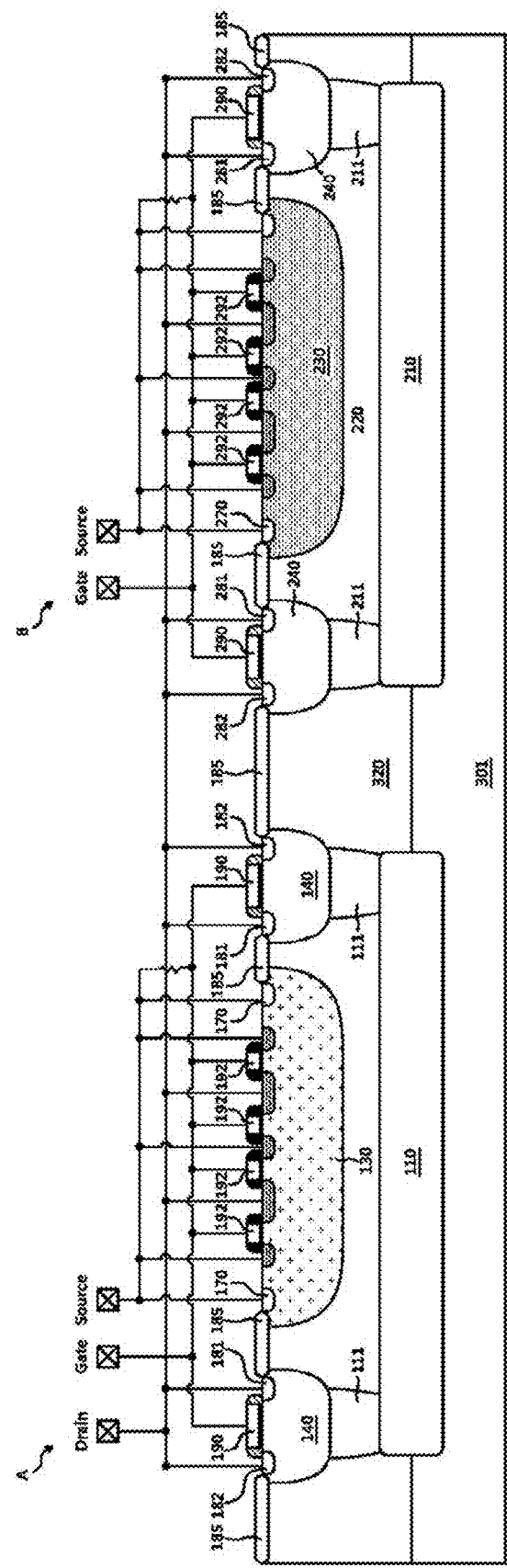
FIG. 13 is a cross-sectional view of FIG. 12.

FIG. 12 is a top view of a semiconductor device in which a GCPMOS and a GCNMOS are combined according to an example of the present description, and FIG. 13 is a cross-sectional view of FIG. 12.

Referring to FIG. 12, the semiconductor device includes a GCPMOS (B) and a GCNMOS (A). The GCNMOS (A) and GCPMOS (B) are disposed spaced apart on the P-type substrate 301. The GCNMOS (A) and the GCPMOS (B) are independently spaced apart from each other and include a first guard ring region 140 surrounding the P-type well region 130 and a second guard ring region 240 surrounding the N-type well region 230. The GCNMOS (A) and the GCPMOS (B) include a first poly gate 190 and a second poly gate 290 on the first guard ring region 140 and the second guard ring region 240, respectively. That is, the first guard ring region 140 and the second guard ring region 240 are spaced apart independently from each other to surround the P-type well region and the N-type well region in a closed-loop, respectively. Further, the semiconductor device does not include the coupling capacitor region as shown in FIG. 12 but includes only the resistor region A-2 of the GCNMOS A and the resistor region B-2 of the GCPMOS B.

Figure 14:
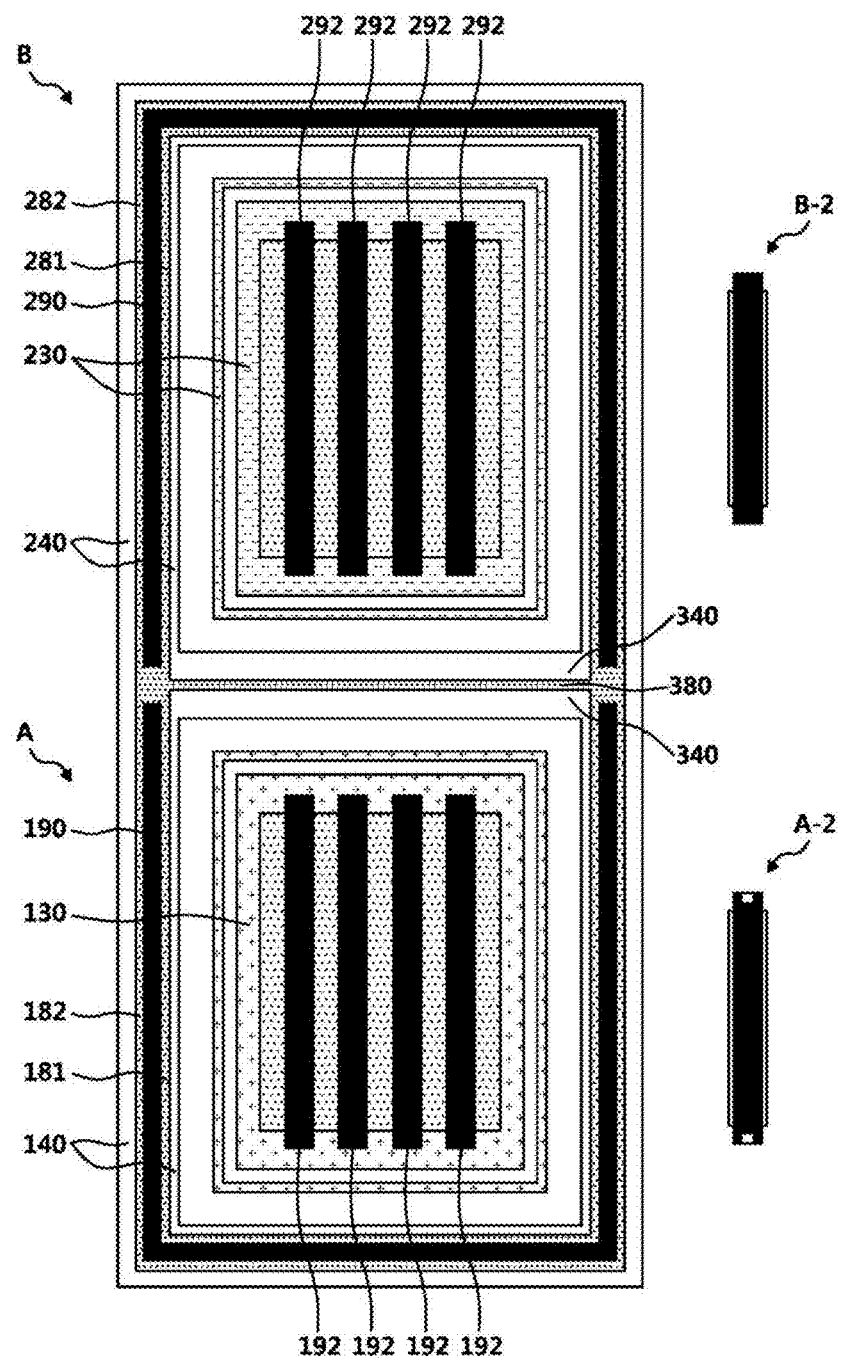
FIG. 14 is a top view of a semiconductor device in which a GCPMOS and a GCNMOS are combined according to another example.
Figure 15:
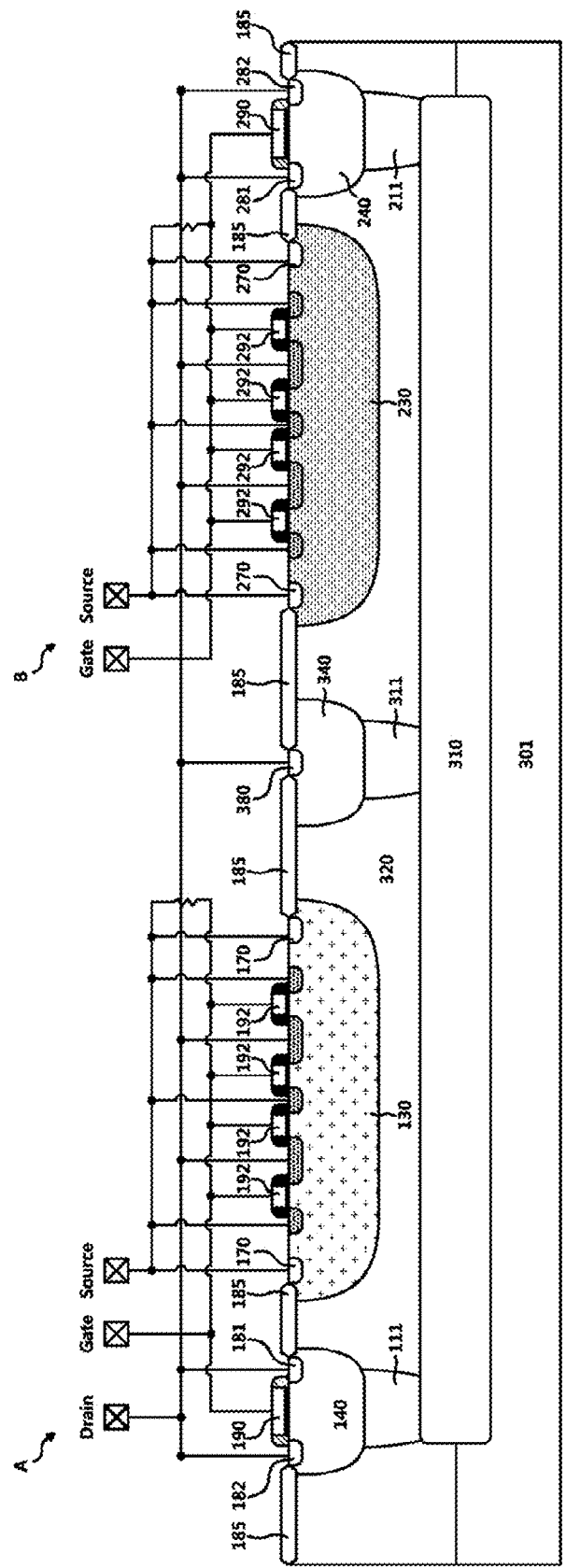
FIG. 15 is a cross-sectional view of FIG. 14.

FIG. 14 is a top view of a semiconductor device in which a GCPMOS and a GCNMOS are combined according to another example of the present description, and FIG. 15 is a cross-sectional view of FIG. 14.

Referring to FIG. 14, the semiconductor device includes a GCPMOS (B) and a GCNMOS (A). The GCNMOS (A) and the GCPMOS (B) are disposed on the P-type substrate 301 in the semiconductor device.

However, in the semiconductor device of FIG. 14, the GCNMOS (A) and the GCPMOS (B) are independently spaced from each other, but the guard ring region is formed differently from that of FIG. 12.

Referring to FIG. 14, the third guard region 340 exists between the N-type well region 230 and the P-type well region 130, and includes the first guard region 140 surrounding the remaining region of the P-type well region 130 where the third guard region 340 does not exist and the second guard region 240 surrounding the remaining region of the N-type well region where the third guard region 340 does not exist.

Referring to FIG. 14, the first to third guard regions 140, 240 and 340 are formed as the same N-type well region so that the first guard region and the third guard region form a closed-loop, and the first guard region and the third guard region form a closed loop.

Referring to FIG. 14, a bulk region 380 is formed on the third guard region 340 and the bulk regions 181 and 182 on the first guard region 140 and the bulk regions 281 and 282 on the second guard region 240 are connected to the bulk region 380 on the third guard region 340.

The GCNMOS (A) and the GCPMOS (B) include a first poly gate 190 and a second poly gate 290 on the first guard region 140 and the second guard region 240, respectively. Because different voltages are to be applied to the gates as in the circuit of FIG. 1, the first poly gate 190 and the second poly gate 290 are not connected to each other and independently disposed on the upper surface of the first guard region and the second guard region.

As illustrated in FIG. 14, the semiconductor device does not include the coupling capacitor region but includes only the resistor region A-2 of the GCNMOS A and the resistor region B-2 of the GCPMOS B.

The semiconductor device of the examples in FIGS. 14 and 15 has a smaller region than that of the examples in FIGS. 12 and 13.

Figure 16:
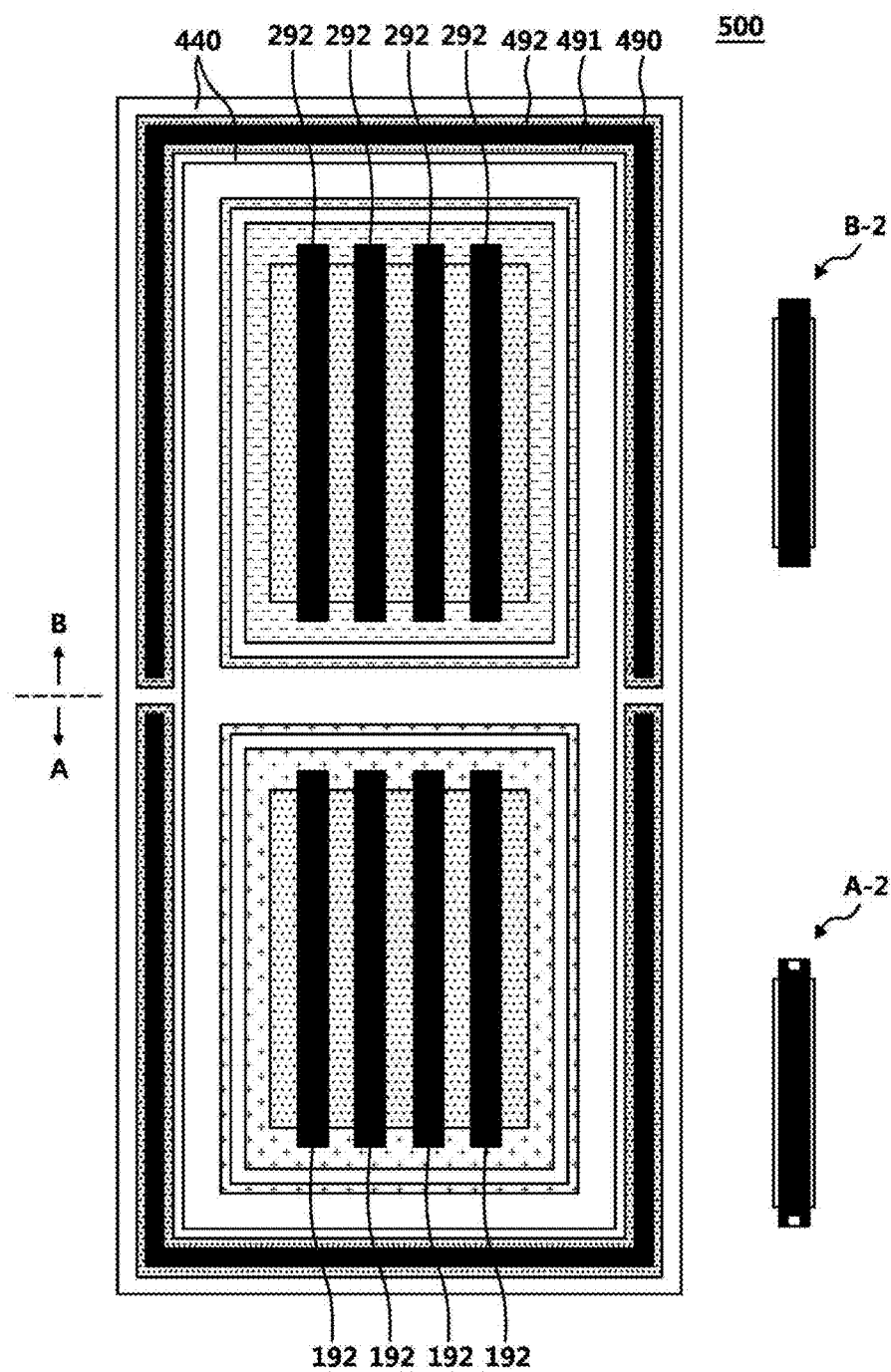
FIG. 16 is a top view of a semiconductor device in which a GCPMOS and a GCNMOS are combined according to another example.
Figure 17:
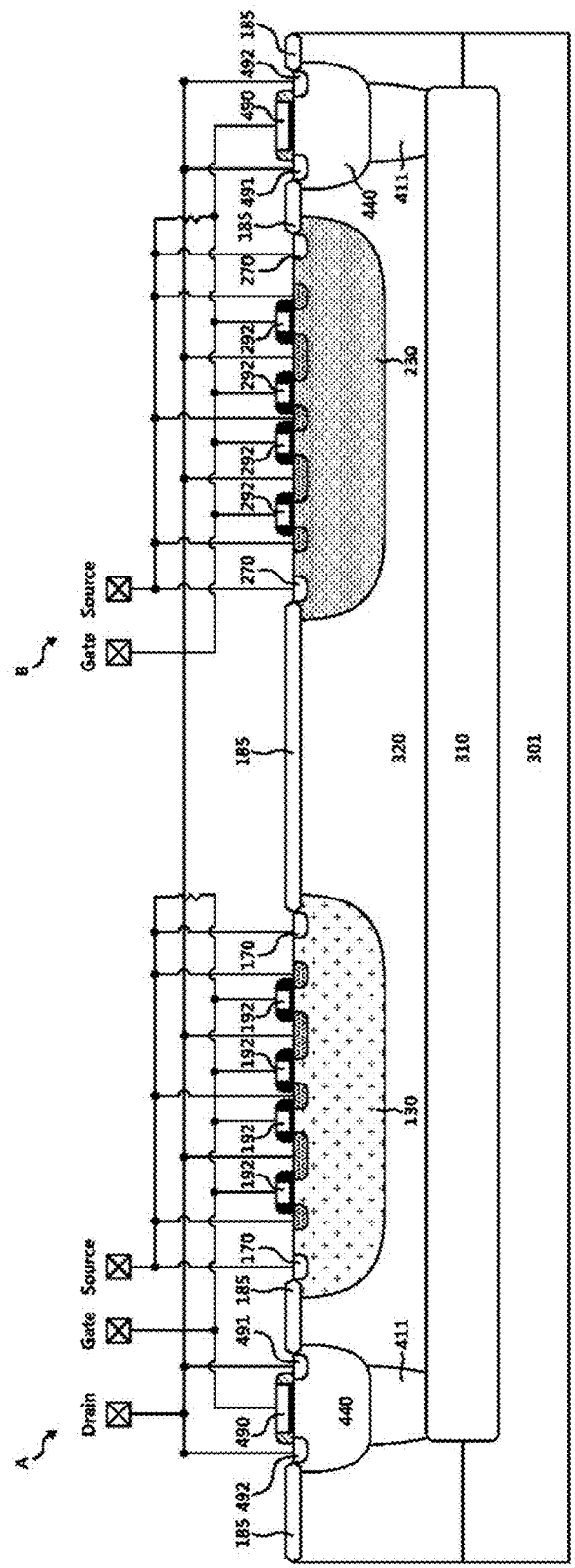
FIG. 17 is a cross-sectional view of FIG. 16.

FIG. 16 is a top view of a semiconductor device 500 in which a GCPMOS and a GCNMOS are combined according to another example of the present description, and FIG. 17 is a cross-sectional view of FIG. 16.

Referring to FIG. 16, the semiconductor device includes a GCPMOS (B) and a GCNMOS (A). The GCNMOS (A) and the GCPMOS (B) are disposed on the P-type substrate 301 in the semiconductor device.

However, in the semiconductor device of FIG. 16, the GCNMOS (A) and the GCPMOS (B) are independently spaced apart from each other, but the guard ring region is formed differently from FIG. 12 or 14.

Referring to FIG. 16, a separate guard region does not exist between the N-type well region 230 and the P-type well region 130. A fourth guard ring region 440 surrounds the P-type well region 130 and N-type well region in the semiconductor device. The poly gate 490 is disposed on the upper surface within the fourth guard ring region 440. Bulk regions 491 and 492 are disposed on both sides of the poly gate 490 within the upper surface of the fourth guard ring region 440. A drain voltage is applied to the bulk region, and a gate voltage is applied to the poly gate 490.

Referring to FIG. 16, the fourth guard ring region 440 is disposed in a closed-loop surrounding and including all the active regions of the GCNMOS (A) and the GCPMOS (B).

However, the bulk region is disposed differently from the guard ring region 440, that is, the bulk region is not disposed in the area where the GCNMOS (A) region and the GCPMOS (B) region face each other. And bulk regions 491 and 492 in open-loop surrounding the area where the GCNMOS (A) and the GCPMOS (B) do not face each other are disposed.

The poly gate 490 on the bulk regions 491 and 492 of the GCNMOS (A) device and the poly gate 490 on the bulk region of the GCPMOS (B) are not connected to each other but independently spaced apart and disposed on a bulk region in open-loop respectively.

As illustrated in FIG. 16, the semiconductor device does not include the coupling capacitor region but includes only the resistor region A-2 of the GCNMOS A and the resistor region B-2 of the GCPMOS B.

The semiconductor device shown in FIGS. 16 and 17 has a much smaller region than that of the semiconductor devices shown in FIGS. 12 and 13 and FIGS. 14 and 15.

Accordingly, the present description may replace the coupling capacitor of the GCMOSFET device due to the intended parasitic capacitor by implementing the poly gate on the deep-well region for distinguishing from the guard ring or the adjacent device of the semiconductor device.

The present description also may reduce the coupling capacitor region of the GCMOSFET semiconductor device by disposing the poly gate on the guard ring or the deep-well region for dividing the adjacent semiconductor devices.

Because the poly gate of the present description may be formed at the same time as forming a gate in the GCMOSFET, an additional process is not required.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a well region comprising a source region and a drain region, each spaced apart from the other;
   a guard ring region disposed around a perimeter of the well region;
   an insulating layer disposed, around the perimeter of the well region, on the guard ring region; and
   a poly gate disposed, around the perimeter of the well region, on the insulating layer.

2. The semiconductor device of claim 1 further comprising,
   a bulk region disposed on an upper surface of the guard ring region adjacent the poly gate.

3. The semiconductor device of claim 2,
   wherein a drain voltage is applied to the bulk region and the drain region.

4. The semiconductor device of claim 1,
   wherein a gate voltage is applied to the poly gate.

5. The semiconductor device of claim 1,
   wherein the well region further comprises a well tap region, and a source voltage is applied to the well tap region and the source region.

6. The semiconductor device of claim 1 further comprising:
   a buried impurity layer disposed spaced apart at a depth deeper than a depth of the well region; and
   a sink region formed under the guard ring region and disposed to be in contact with the buried impurity layer.

7. The semiconductor device of claim 1,
   wherein the semiconductor device is a gate-coupled first conductivity type semiconductor device or a gate-coupled second conductivity type semiconductor device.

8. The semiconductor device of claim 1, wherein the well region is a P-type well region further comprising a well tap region and a gate electrode.

9. The semiconductor device of claim 8, wherein an epitaxial layer is disposed around the P-type well region.

10. The semiconductor device of claim 9, wherein an isolation region is disposed between the guard ring region and the P-type well region.

11. A semiconductor device comprising:
    a P-type substrate;
    a P-type well region, disposed on the P-type substrate, comprising source regions and drain regions each spaced apart from the other;
    an N-type well region disposed and spaced apart from the P-type well region on the P-type substrate, the N-type well region comprising the source regions, and the P-type well region comprising the drain regions;
    an N-type guard ring region disposed around perimeters of the P-type well region and the N-type well region;
    an insulating layer disposed to around the P-type well region and the N-type well region on the N-type guard ring region;
    a poly gate disposed, around the perimeters of the P-type well region and the N-type well region, respectively, on the insulating layer; and
    a bulk region disposed on the N-type guard ring region adjacent the poly gate.

12. The semiconductor device of claim 11, wherein the N-type guard ring region comprises:
    a first guard ring region forming a closed-loop around the perimeter of the P-type well region; and
    a second guard ring region, independent and separate from the first guard ring region, forming a closed-loop around the perimeter of the N-type well region.

13. The semiconductor device of claim 11, wherein the N-type guard ring region comprises:
    a first guard region disposed between the P-type well region and the N-type well region;
    a second guard region, connected to the first guard region in a closed loop, surrounding a portion of the perimeter of the P-type well region; and
    a third guard region, connected to the first guard region in a closed loop, surrounding a portion of the perimeter of the N-type well region.

14. The semiconductor device of claim 11, wherein the N-type guard ring region is disposed in a closed loop surrounding both the P-type well region and the N-type well region.

15. The semiconductor device of claim 14,
    wherein a drain voltage is applied to the bulk region and the drain regions.

16. The semiconductor device of claim 11,
    wherein a gate voltage is applied to the poly gate.

17. The semiconductor device of claim 11 further comprising:
    a first buried layer disposed spaced apart at a depth deeper than a depth of the P-type well; and
    a first sink layer formed under the N-type guard ring and disposed to be in contact with the first buried layer.

18. The semiconductor device of claim 17 further comprising:
    a second buried layer disposed spaced apart at a depth deeper than a depth of the N-type well; and
    a second sink layer formed under the N-type guard ring and disposed to be in contact with the second buried layer.

19. A semiconductor device with electrostatic discharge protection comprising:
- a deep well region;
- a well region, disposed in the deep well region, comprising source regions and drain regions each spaced apart from the other, respectively;
- an insulating layer disposed around a perimeter of the well region on the deep well region;
- a poly gate disposed around the perimeter of the well region on the insulating layer; and
- a bulk region disposed on the deep well region adjacent the poly gate.

20. The semiconductor device of claim 19,
- wherein a gate voltage is applied to the poly gate, and a drain voltage is applied to the bulk region.

21. A semiconductor device, comprising:
- a P-type well region comprising a well tap region, a source region, a gate electrode, and a drain region;
- an N-type deep well region disposed around the P-type well region;
- an insulating layer disposed, around the perimeter of the P-type well region, on the N-type deep well region; and
- a poly gate disposed, around the perimeter of the P-type well region, on the insulating layer.

22. The semiconductor device of claim 21, wherein an isolation region disposed between the guard ring region and the poly gate.

* * * * *

UNITED STATES PATENT AND TRADEMARK OFFICE
CERTIFICATE OF CORRECTION

PATENT NO. : 11,056,482 B2  
APPLICATION NO. : 16/682320  
DATED : July 6, 2021  
INVENTOR(S) : Won Jong Baek Page 1 of 1

It is certified that error appears in the above-identified patent and that said Letters Patent is hereby corrected as shown below:

In the Claims

Column 16, In Claim 11, Line 8, delete "the" before "source regions."

Signed and Sealed this  
Tenth Day of August, 2021

Drew Hirshfeld  
*Performing the Functions and Duties of the*  
*Under Secretary of Commerce for Intellectual Property and*  
*Director of the United States Patent and Trademark Office*